(12) United States Patent
Budach et al.

(10) Patent No.: US 10,410,820 B2
(45) Date of Patent: Sep. 10, 2019

(54) BEAM BLANKER AND METHOD FOR BLANKING A CHARGED PARTICLE BEAM

(71) Applicant: Carl Zeiss SMT GmbH, Oberkochen (DE)

(72) Inventors: Michael Budach, Hanau (DE); Christof Baur, Darmstadt (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/824,004

(22) Filed: Nov. 28, 2017

(65) Prior Publication Data

US 2018/0151327 A1   May 31, 2018

(30) Foreign Application Priority Data

Nov. 29, 2016   (DE) .................. 10 2016 223 664

(51) Int. Cl.
    *H01J 37/04*    (2006.01)
    *H01J 37/28*    (2006.01)
    *H01J 37/285*   (2006.01)

(52) U.S. Cl.
    CPC ............ *H01J 37/045* (2013.01); *H01J 37/28* (2013.01); *H01J 37/285* (2013.01); *H01J 2237/0432* (2013.01); *H01J 2237/28* (2013.01); *H01J 2237/31742* (2013.01)

(58) Field of Classification Search
    CPC ......... H01J 37/045; H01J 37/28; H01J 37/285
    USPC ..................................... 250/396 R
    See application file for complete search history.

(56) References Cited

U.S. PATENT DOCUMENTS

| | | | |
|---|---|---|---|
| 3,849,659 A | * | 11/1974 | O'Keeffe ............... B82Y 10/00 219/121.12 |
| 4,063,091 A | | 12/1977 | Gee |
| 4,710,640 A | | 12/1987 | Kawasaki |
| 4,721,909 A | | 1/1988 | Richardson |
| 5,345,080 A | | 9/1994 | Yajima et al. |
| 6,278,124 B1 | | 8/2001 | Penberth et al. |

(Continued)

OTHER PUBLICATIONS

German Office Action for German Application No. 10 2016 223 664.4 dated Dec. 29, 2016 (10 pages).

*Primary Examiner* — Nicole M Ippolito
(74) *Attorney, Agent, or Firm* — Fish & Richardson P.C.

(57) ABSTRACT

The present invention relates to a beam blanker for a scanning particle microscope for blanking a charged particle beam having a beam axis, along which charged particles propagate before entering the beam blanker, wherein the beam blanker comprises: (a) at least one stop having an aperture, through which the charged particle beam can pass; (b) at least one first and one second deflection element, which are each configured to deflect the particle beam from the beam axis in a first and a second direction, respectively, upon a voltage being present; and (c) a deflection controller configured to apply a first AC voltage having a first frequency to the first deflection element and a second AC voltage having a second frequency to the second deflection element, wherein the deflection controller sets a difference frequency between the first and second AC voltages such that pulses of the charged particle beam have a predefined pulse period and during the pulse period outside the pulse duration substantially no charged particles pass through the aperture of the stop.

21 Claims, 12 Drawing Sheets

(56) References Cited

U.S. PATENT DOCUMENTS

| | | | |
|---|---|---|---|
| 2003/0030901 A1* | 2/2003 | Knebel | G02B 21/002 |
| | | | 359/388 |
| 2005/0253069 A1 | 11/2005 | Zewail et al. | |
| 2007/0138413 A1 | 6/2007 | Abe et al. | |
| 2009/0026912 A1 | 1/2009 | Lordi et al. | |
| 2012/0261586 A1 | 10/2012 | Knippels et al. | |
| 2014/0103225 A1* | 4/2014 | Kieft | H01J 37/28 |
| | | | 250/440.11 |

* cited by examiner

BEAM BLANKER AND METHOD FOR BLANKING A CHARGED PARTICLE BEAM

CROSS-REFERENCE TO RELATED APPLICATION

This application claims the benefit of German patent application DE 10 2016 223 664.4, entitled "Strahlaustaster und Verfahren zum Austasten eines geladenen Teilchenstrahls" and filed on Nov. 29, 2016, which is incorporated by reference herein in its entirety.

TECHNICAL FIELD

The present invention relates to a beam blanker and a method for blanking a charged particle beam.

BACKGROUND

Advances in nanotechnology make it possible to produce components with structure elements becoming smaller and smaller. Examining the components produced, for example integrated circuits, requires tools that can scan these structures without mechanical contact, such that the measurement data can be taken as a basis for deciding whether the components fulfil a predefined specification. The clock frequency of integrated circuits extends right into the GHz frequency range (e.g., greater than 4 GHz). Since the bandwidth of present-day detectors, for instance of secondary electron detectors, at 10 MHz to 100 MHz is far below the clock frequency of integrated circuits that are customary nowadays, microelectronic components are typically measured stroboscopically during operation. This requires short pulses of charged particles, preferably electron pulses, with low jitter. The pulse duration and jitter have a major influence on the detection bandwidth that can be achieved. Analyzing components of an integrated circuit that are in operation typically necessitates, e.g., pulse durations of less than 50 ps and jitter of less than 30 ps.

Short pulses are likewise required in a second field of use, the repair of photolithographic masks (referred to as: Focused Electron Beam Induced Processing (FEBIP)). In addition, it is necessary to precisely control the times in which the beam is on or off, and indeed the pulse duration and pulse period or the pulse repetition rate make it possible to set the ratio of adsorption of gas molecules at the surface of a photolithographic mask and chemical conversion of the adsorbed gas molecules under the influence of the particle beam.

Pulses of charged particles can be generated in a plurality of ways. US 2009/0026912 A1 describes, inter alia, generating pulses by irradiating the cathode of an electron source with electron pulses. The incorporation of additional components into the electron source leads to a complex apparatus for generating a pulsed electron beam.

US 2005/0253069 A1 reports on the direct generation of short pulses in an electron source (of a heated $LaB_6$ crystal) with the aid of pulsed photoemission, i.e. by bombardment with ultrashort light pulses originating from a laser system. What is disadvantageous about this method is the low radiant intensity of the electron pulses generated, which is insufficient for many applications.

On account of the disadvantages mentioned, at the present time pulses of charged particles are preferably still generated by blanking a continuous particle beam. A beam blanker typically comprises a pair of deflection plates and a stop having an aperture, through which the particle beam has to pass in order to reach the sample arranged behind or beam-downstream. As a result of an electrical voltage being applied to the deflection plates, the charged particle beam is deflected and impinges on the stop instead of passing through the aperture of the stop. The shortest time in which a charged particle beam can be switched on and off depends on the length and width of the deflection plates, the distance between the latter, and also the diameter of the aperture and the distance between the deflection plates and the stop. Furthermore, the achievable pulse duration is determined by the rate of rise of the voltage and the magnitude of the voltage at the printed circuit boards in the final state.

In order to alleviate the problems of deflecting a charged particle beam with the aid of printed circuit boards, in particular the rate of rise of the voltage, the U.S. patent specification with No. 4,721,909 proposes a coaxial transmission line for deflecting an electron beam. In addition, a controlled detector ("gated detector") is used for filtering undesired pulses.

The partly conflicting requirements explained above make it difficult to generate short pulses using a beam blanker comprising a single pair of printed circuit boards, particularly if a compact design of the beam blanker is additionally demanded.

The author A. Gopinath describes in Chapter 9. VII. 8 of the book "Beam Processing Technologies," edited by S. G. Einspruch, S. S. Cohen and R. N. Singh (ISBN 1-48-320442), deflection structures having more than two printed circuit boards which can be incorporated into an electro-optical column of a scanning electron microscope. By way of example, the author elucidates a complex deflection structure comprising two spatially separated deflection plate systems, in which the particle beam circulates on a circle after passing through the first deflection plate system and the duty ratio is settable by a multi-electrode deflection element. The second deflection plate system brings the charged particle beam back to its original beam direction again.

US 2014/0103225 A1 describes a beam blanker embodied in the form of a resonant structure. The resonant structure is excited with two slightly different frequencies, which enable a settable deflection of a charged particle beam in a plane perpendicular to the beam direction.

US 2012/261586 A1 describes a beam blanker that uses a pair of printed circuit boards to deflect a charged particle beam. The electric field is generated in a resonant LC structure at a resonant frequency f at which the charged particle beam sweeps over the aperture of a stop twice during a period duration. Two beam blankers can be arranged successively in the beam direction and jointly use specific components of a beam blanker, such as the stop, for instance. The charged particle beam generates a Lissajous figure on a stop.

The resonant deflection structures of the last two documents cited significantly restrict the flexibility when setting the pulse durations and in particular the pulse repetition rate or the pulse period, since the resonance condition defines the frequency at which the resonant deflection structures can be operated.

The information provided above is merely to assist the reader in understanding the background of the invention. Some of the information provided above may not be prior art to the invention.

The present invention therefore addresses the problem of specifying a beam blanker and provides a method for blanking a charged particle beam which at least partly avoids the disadvantages mentioned above.

SUMMARY

In a general aspect, in accordance with one exemplary embodiment of the present invention, this problem is solved by a beam blanker for a scanning particle microscope for blanking a charged particle beam having a beam axis, along which charged particles propagate before entering the beam blanker. The beam blanker comprises: (a) at least one stop having an aperture, through which the charged particle beam can pass; (b) at least one first and one second deflection element, which are each configured to deflect the particle beam from the beam axis in a first and a second direction, respectively, upon a voltage being pre-sent; and (c) a deflection controller configured to apply a first AC voltage having a first frequency to the first deflection element and a second AC voltage having a second frequency to the second deflection element, wherein the deflection controller sets a difference frequency between the first and second AC voltages such that pulses of the charged particle beam have a predefined pulse period and during the pulse period outside the pulse duration substantially no charged particles pass through the aperture of the stop.

In one exemplary embodiment, the beam blanker comprises two independent deflection elements, which can be driven independently of one another. This makes it possible to set a predefined pulse duration by selecting a first frequency for a first AC voltage. By selecting a second frequency for a second AC voltage, it is possible for the pulse period, i.e. the temporal sequence of the passage of the pulses through the aperture of the stop, to be set in a freely selectable manner. The rigid relationship between pulse duration and pulse period is broken down. As a result, the flexibility of the use of a beam blanker according to the invention is significantly increased in comparison with apparatuses from the prior art. A criterion monitored by the deflection controller prevents parasitic pulses from occurring during the pulse period.

The settable difference frequency can be determined by a size of the aperture of the stop, a diameter of the charged particle beam and the selection of the frequencies of the first or second AC voltage, for example.

In this case, the greater of the two geometric variables of aperture of the stop and diameter of the charged particle beam can have the greater influence on the difference frequency to be set.

The beam blanker can furthermore comprise a phase shifter configured to vary a phase of the first AC voltage relative to the phase of the second AC voltage.

Preference is given to phase shifters which can vary the phase in a continuously variable manner over an oscillation period and can be used in a larger frequency range. The phase shifter can shift the phase of one AC voltage or the phases of two AC voltages having two different frequencies relative to one another.

The first deflection element and the second deflection element can be at a substantially identical distance from the aperture of the stop.

Here and elsewhere in this application the expression "substantially" signifies an indication within customary measurement errors in the determination of the corresponding variable when measuring apparatuses in accordance with the prior art are used.

The first deflection element can comprise a first deflection electrode pair, the deflection electrodes of which are arranged substantially parallel to the beam axis on both sides of the particle beam, and/or the second deflection element can comprise a second deflection electrode pair, the deflection electrodes of which are arranged substantially parallel to the beam axis on both sides of the particle beam.

This is one possible arrangement of deflection elements. Given a predefined voltage to be applied to the deflection elements, this arrangement makes it possible to maximize the electric field strength through which the charged particle beam passes, and thus to maximize the deflection of the particle beam by the deflection element.

The deflection electrodes can comprise rectangular printed circuit boards having a width of 0.1 mm to 100 mm, preferably 0.5 mm to 20 mm, more preferably 1 mm to 10 mm, and most preferably 2 mm to 5 mm, and/or having a height of 1 mm to 100 mm, preferably 3 mm to 70 mm, more preferably 5 mm to 50 mm, and most preferably 10 mm to 30 mm.

Besides rectangular or square, planar printed circuit boards, it is also possible to use deflection electrodes having some other shape. By way of example, it is possible to use deflection electrodes having the shape of circle segments. Moreover, it is not necessary for the deflection electrodes of both deflection electrode pairs to have the same shape and/or identical dimensions.

The deflection electrodes of a deflection electrode pair (140, 150) can be at a distance of 0.1 mm to 100 mm, preferably 0.5 mm to 20 mm, more preferably 1 mm to 10 mm, and most preferably 2 mm to 5 mm.

The first and second deflection electrode pairs can form an angle of substantially 90°. As a result, the noise and jitter in the voltage applied to the deflection electrode pairs affect the jitter of the pulse frequency to a lesser extent. In addition, the paths of the electron beam are at a better distance from the aperture of the stop.

The first and second deflection electrode pairs can have a maximum overlap along the beam axis. In one exemplary configuration, the first and second deflection electrode pairs have a maximum overlap along the beam axis if their distance from the aperture of the stop is substantially identical in magnitude.

This arrangement of the deflection elements makes it possible to manufacture beam blankers of compact design.

The two deflection electrode pairs and the at least one stop, along the beam axis, can be at a distance of 0.1 mm to 1000 mm, preferably 0.5 mm to 200 mm, more preferably 1 mm to 100 mm, and most preferably 2 mm to 50 mm.

The first AC voltage can comprise a sinusoidal AC voltage and the second AC voltage can comprise a ramped AC voltage. It is furthermore possible for both AC voltages to comprise sinusoidal or ramped AC voltages.

The beam blanker can furthermore comprise a first voltage source for generating a first AC voltage for connection to the first deflection electrode pair and/or a second voltage source for generating a second AC voltage for connection to the second deflection electrode pair.

The first voltage source can be configured to generate an AC voltage in a frequency range of 1 kHz to 10 GHz, preferably 5 kHz to 2 GHz, more preferably 10 kHz to 1 GHz, and most preferably 20 kHz to 500 MHz, and/or the second voltage source can be configured to generate a voltage rise of the ramped output voltage in a time range of 1 ps to 1000 µs, preferably 5 ps to 500 µs, more preferably 20 ps to 200 µs, and most preferably 100 ps to 100 µs.

The beam blanker can moreover comprise at least one first amplifier configured to provide an AC voltage having a voltage amplitude in the range of 10 V to 1000 V, preferably 20 V to 500 V, more preferably 40 V to 500 V, and most preferably 50 V to 200 V, in a frequency range of 1 kHz to 1000 MHz.

Moreover, the beam blanker can comprise a DC voltage source configured to generate a DC voltage of ±0.1 keV to ±100 keV, preferably ±0.2 keV to ±50 keV, more preferably ±0.3 keV to ±20 keV, and most preferably ±0.4 keV to ±10 keV, for application to the first and/or the second deflection electrode pair. Preferably, the beam blanker just like the column of a scanning electron microscope is at positive potential in order that the electrons are accelerated and thus have a high kinetic energy. Shortly before reaching the sample, the electrons are decelerated to a predefined landing energy.

Furthermore, the beam blanker can comprise electrical terminals configured to apply a DC voltage to the first deflection electrode pair and/or the second deflection electrode pair.

The at least one stop can be arranged substantially perpendicular to the beam axis of the charged particle beam.

The at least one stop can have a round aperture having a diameter of 10 μm to 10 mm, preferably 50 μm to 20 mm, more preferably 100 μm to 5 mm, and most preferably 200 μm to 1 mm, and/or the at least one stop can have a round shape having a diameter of 15 mm to 10 cm, preferably 20 mm to 8 cm, more preferably 25 mm to 6 cm, and most preferably 30 mm to 3 cm.

It is advantageous to design the aperture of the stop to be as small as possible. However, the stop should not trim the beam, since this leads to a loss of beam current. The beam diameters of present-day scanning electron microscopes are typically in the range of 100 μm to 200 μm.

The aperture of the stop can be shaped arbitrarily. A round aperture or an aperture in the shape of a polygon is preferred since apertures having these shapes can be manufactured in an expedient manner. The outer contour of the stop can be shaped arbitrarily and thus adapted to the space conditions of the scanning particle microscope into which the beam blanker is incorporated.

The at least one stop can comprise a metal and have a thickness of 0.5 μm to 2000 μm, preferably 5 μm to 1000 μm, more preferably 50 μm to 800 μm, and most preferably 100 μm to 600 μm A stop can be manufactured from an arbitrary material present in the form of a solid. In this case, the thickness of the stop should be adapted to the material used. It generally holds true that the higher the atomic number of the material or materials of the stop, the better it stops charged particles. Furthermore, it should be taken into consideration that the thickness of the material should be adapted to the maximum energy of the particle beam.

The at least one stop can be configured to absorb ≥98%, preferably ≥99%, more preferably ≥99.5%, most preferably ≥99.9%, of the charged particle beam.

The pulse duration of the charged particle beam at the output of the beam blanker can comprise a range of 1 ps to 1000 μs, preferably 2 ps to 100 μs, more preferably 4 ps to 10 μs, and most preferably 5 ps to 1 μs.

The period duration of the charged particle beam at the output of the beam blanker can comprise a range of 1 ns to 1 ms, preferably 5 ns to 100 μs, more preferably 10 ns to 10 μs, and most preferably 20 ns to 1 μs.

The beam blanker can furthermore comprise electrical terminals configured to apply a DC voltage to the first blanking electrode pair and/or the second blanking electrode pair.

In addition, the beam blanker can comprise at least one electromagnetic coupling member for the potential-free connection of the first or the second AC voltage to the first deflection element or the second deflection element, and wherein the electromagnetic coupling member is furthermore configured to superimpose a selectable DC voltage on the first or second AC voltage.

In accordance with a further aspect, the present invention relates to a beam blanker for a scanning particle microscope for blanking a charged particle beam having a beam axis, along which charged particles propagate before entering the beam blanker, wherein the beam blanker comprises: (a) at least one stop having an aperture, through which the charged particle beam can pass; (b) at least one deflection element configured to deflect the particle beam from the beam axis upon a voltage being present; (c) an electromagnetic coupling member for the potential-free connection of an AC voltage to the at least one deflection element; (d) wherein the electromagnetic coupling member is furthermore configured to superimpose a selectable DC voltage on the AC voltage.

In modern scanning particles microscopes, for example in modern scanning electron microscopes, extensive portions of the electron optical system are often at a high potential. By virtue of the fact that the AC voltage(s) applied to one or a plurality of deflection elements are fed in a potential-free manner, it is possible to adapt the one or the plurality of deflection elements of the beam blanker to the potential conditions prevailing at the installation location of the beam blanker, for example in a column of a scanning particle microscope.

The electromagnetic coupling member can comprise a transformer.

Furthermore, the present invention relates to a scanning particle microscope having a beam axis, along which a charged particle beam propagates, which may comprise: (a) a particle source for generating the charged particle beam; (b) at least one electro-optical lens for imaging the charged particle beam; (c) a beam blanker according to any of the aspects described above; and (d) a sample stage for holding and/or positioning a sample with respect to the charged particle beam.

A scanning particle microscope equipped with a beam blanker defined above can be used for repairing photolithographic masks. By setting the pulse duration of the charged particle beam and, independently thereof, the pulse period, the repetition time duration or the duty ratio, it is possible to control the chemical conversion of the molecules adsorbed at the surface of the photolithographic mask. However, a scanning particle microscope containing a beam blanker specified above is not restricted to the repair of photolithographic masks. Rather, the beam blanker can be used for all applications in which rapidly proceeding processes have to be detected without contact. This applies for example to the analysis of integrated circuits that are in operation, or to the examination of the reaction dynamics of chemical processes.

The scanning particle microscope can comprise a scanning electron microscope. The scanning particle microscope can furthermore comprise at least one scanning probe microscope. The scanning probe microscope can comprise an atomic force microscope (AFM).

In accordance with a further aspect, the present invention relates to a method for setting a pulse duration and a pulse period of pulses of a charged particle beam in a beam blanker for a scanning particle microscope, wherein the beam blanker comprises: at least one stop having an aperture, through which the charged particle beam can pass; at least one first and one second deflection element, which are configured to deflect the particle beam from the beam axis in a first and a second direction, respectively, upon a voltage being present, and wherein the method comprises the following steps: (a) determining a first frequency for a first AC voltage for application to the first deflection element; (b) determining a second frequency for a second AC voltage for application to the second deflection element; and (c) wherein determining the second frequency is carried out such that the pulses of the charged particle beam have a predefined pulse period and during the pulse period outside the pulse duration substantially no charged particles pass through the aperture of the stop.

The method can furthermore comprise the step of: determining a maximum length of the pulse period by minimizing a settable difference frequency between the first frequency of the first AC voltage and the second frequency of the second AC voltage.

In addition, the method can comprise the step of: varying a phase difference between the first and second AC voltages for setting a position of the charged particle beam relative to the aperture of the stop.

Furthermore, the method can comprise the step of: adapting a voltage amplitude of the first and/or the second AC voltage for generating the predefined pulse duration and/or the selectable pulse period.

Furthermore, the method can comprise the step of: determining a size of the aperture of the stop and/or determining a diameter of the charged particle beam.

In addition, the method can comprise the step of: determining the kinetic energy which the charged particle beam has upon entering the beam blanker.

DESCRIPTION OF DRAWINGS

The following detailed description describes currently preferred exemplary embodiments of the invention, with reference being made to the drawings, in which.

DETAILED DESCRIPTION

Currently preferred embodiments of a beam blanker according to the invention and of a method according to the invention for generating pulses of charged particles with a settable pulse duration and pulse period are explained in greater detail below. Furthermore, in one application example, a beam blanker according to the invention is explained as part of a scanning electron microscope. However, the application of the beam blanker described is not restricted to the application example indicated. Rather, the beam blanker presented can be incorporated into an arbitrary scanning particle microscope and be employed for generating short pulses of charged particles with a settable pulse period or pulse repetition time.

Figure 1:
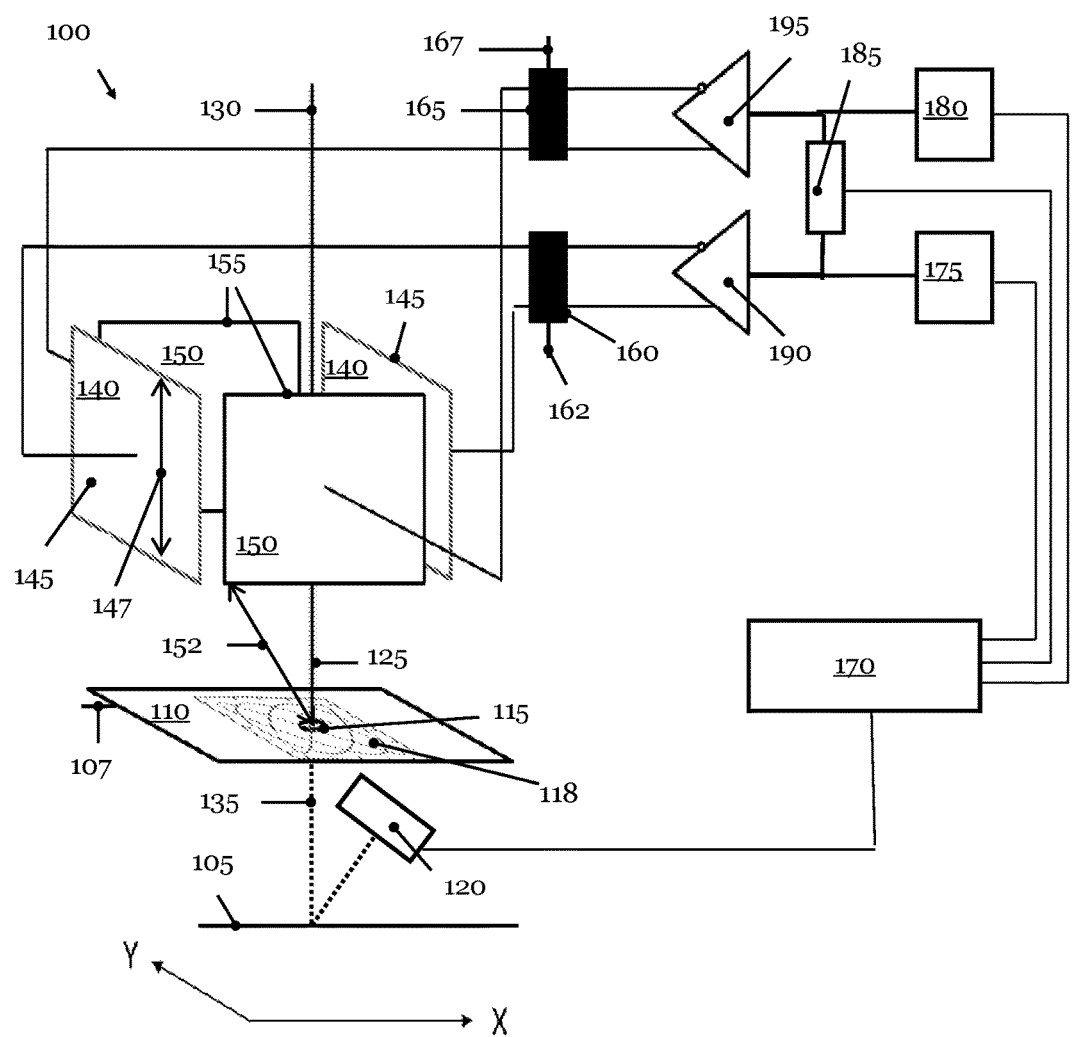
FIG. 1 schematically shows some important components of a beam blanker.

FIG. 1 schematically shows some components of an exemplary beam blanker 100. The beam blanker 100 comprises a stop 110 or a beam catcher 110 having an aperture 115 or an opening 115. The stop 110 is preferably manufactured from a metal or a metal alloy. Metals having a high atomic number are advantageous since heavy elements effectively decelerate and finally absorb charged particle beams. The thickness of the stop 110 or of the beam catcher 110 depends firstly on the maximum energy of the charged particles that the stop 110 is intended to absorb, and secondly on the type of particles to be absorbed. By way of example, high-energy electrons produce less damage than high-energy ions, which by virtue of their sputtering effect lead to a slow erosion of the material of the stop 110. Beam blankers used in scanning electron microscopes typically comprise stops composed of molybdenum, platinum or a platinum-iridium alloy.

The external dimensions of the beam catcher 110 depend on the geometry of the other components of the beam blanker 100 and also the available installation space for the beam blanker 100 in a scanning particle microscope. In the beam blanker 100 in FIG. 1, the stop 110 is embodied in the form of a planar plate. The stop 110 can also have a different shape; by way of example, the stop can have a convex or a concave shape with respect to the beam axis.

The stop 110 comprises a terminal 107, which makes it possible to vary the potential of the stop 110 relative to the potential of the charged particle beam. For this purpose, it is necessary to electrically insulate the electrically conductive stop 110 from the other components of the beam blanker 100.

The aperture 115 or the opening 115 of the stop 110 of the beam blanker 100 is a central variable for the generation of a short pulse by the beam blanker 100. It is selected depending on the distance and the height of the deflection electrode pairs and also the voltage applied to the blanking electrodes and the rate of rise of the voltage at the deflection electrode pairs. The shape of the aperture 115 of the stop 110 can be selected arbitrarily. It is advantageous, however, to use easily producible apertures 115. Round apertures 115 or openings 115 in the form of polygons have this property. Furthermore, in order to generate pulses that are as short as possible, it is advantageous to adapt the shape of the aperture 115 of the stop 110 to the shape of a charged particle beam. Stops 110 having round apertures which have a diameter in the range of 100 µm to 1000 µm are incorporated into the beam blanker 100.

On the one hand, shorter pulse durations can be achieved as the diameter of the aperture 115 of the stop 110 decreases. On the other hand, a small diameter of the aperture 115 makes it difficult to align a beam axis 130 of the charged particle beam 125 with the aperture 115 of the beam catcher 110. If the diameter of the aperture 115 of the stop 110 is selected to be smaller than the beam diameter, the intensity of the beam current is moreover reduced. The charged particle beam 125 is aligned such that it passes through the aperture 115 of the stop 110 when the beam blanker 100 is inactive. The charged particle beam 125 reaches the sample 105 when the beam blanker 100 is inactive. It generates backscattered electrons or secondary electrons on and/or in the sample 105, which electrons are detected with the aid of the detector 120.

However, it is also possible to select the alignment of the beam axis 125 such that only a deflected particle beam 125 can pass through the aperture 115 of the stop 110.

The beam axis 130 is parallel to the z-axis of a coordinate system of the beam blanker 100. The x- and y-directions of the coordinate system form the stop plane in the example in FIG. 1.

The deflection electrodes 145 of the first deflection electrode pair 140 deflect the charged particle beam 125 in the x-direction. The deflection electrodes 155 of the second deflection electrode pair 150 lead to a deflection of the charged particle beam 125 in the y-direction upon a voltage being applied. In this case, the height 147 of the blanking electrodes 145, 155 and the distance between the blanking electrodes 145, 155 influence the extent of the deflection of the charged particle beam 125 from the beam axis 130. As the distance 152 between the deflection electrodes 145, 155 and the stop 110 increases, the deflection of the charged particle beam 125 increases linearly.

In the exemplary beam blanker 100 in FIG. 1, the deflection electrodes 145, 155 are embodied in the form of square printed circuit boards. The metallic deflection electrodes 145, 155 in FIG. 1 have a side length in the range of 1 mm to 1 cm. In the exemplary beam blanker 100, the two deflection electrodes 145, 155 of a deflection electrode pair 140, 150 are at a distance which substantially corresponds to the side length of the deflection electrodes.

It is not necessary for the deflection electrodes 145, 155 to have a square shape. Depending on the application, it may be advantageous to use rectangular printed circuit boards as deflection electrodes 145, 155, the height 147 of which is greater than the width and is preferably in the range of 5 mm to 5 cm. Furthermore, it is not necessary for the first deflection electrode pair 140 and the second deflection electrode pair 150 to comprise substantially identical deflection electrodes 145 and 155. In addition, it is furthermore possible to use non-planar deflection electrodes for example in the form of circle segments (not illustrated in FIG. 1). Moreover, the deflection electrodes 145 of the first deflection electrode pair 140 and the deflection electrodes 155 of the second deflection electrode pair 150 can be shaped differently and/or have different dimensions (illustrated in FIG. 1).

The AC voltages applied to the deflection electrodes 145, 155 from the amplifiers 190 and 195 can be isolated in terms of potential from the potential of the deflection electrode pairs 140, 150 by the electromagnetic coupling members 160 and 165. The electromagnetic coupling members 160 and 165 are optionally elements of the beam blanker 100. The electromagnetic coupling members 160 and 165 comprise terminals 162 and 167, which make it possible additionally to apply a DC voltage to one or both of the deflection electrode pairs 140, 150. In the use in a scanning electron microscope as described later, a positive DC voltage in the single-digit kilovolts range is preferably applied to the deflection electrode pairs 140, 150

Figure 2:
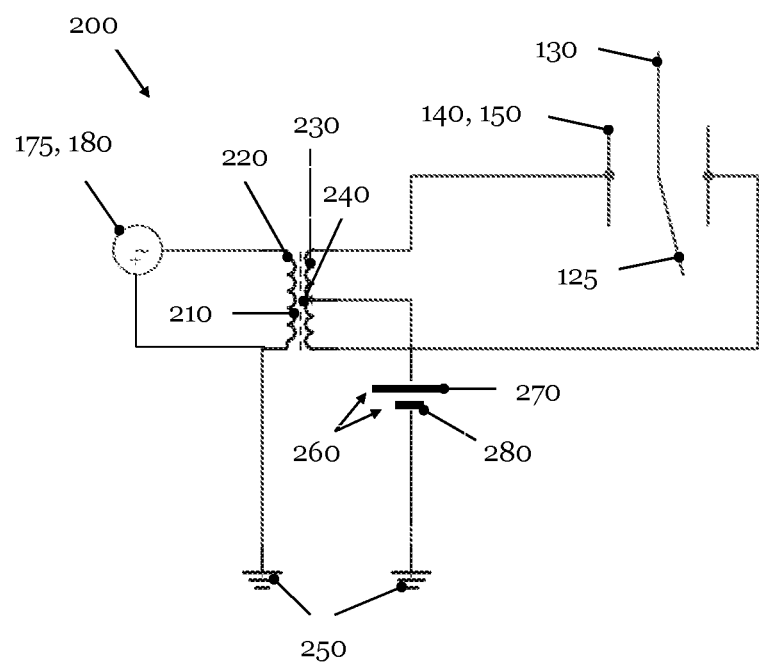
FIG. 2 schematically illustrates one embodiment of an electromagnetic coupling member.

The diagram 200 in FIG. 2 schematically shows one example of an electromagnetic coupling member 160, 165 in the form of a transformer 210. The primary side 220 of the transformer 210 is connected to one of the amplifiers 190 or 195.

Furthermore, one of the terminals of the primary side 220 of the transformer 210 is earthed. The secondary side 230 of the transformer 210 has a center tap 240. The center tap 240 is symbolized in FIG. 1 by the terminals 162 and 167 of the electromagnetic coupling members 160 and 165 of the beam blanker 100.

With the aid of the DC voltage source 260, the positive terminal 270 of which is connected to the center tap 240 of the secondary side of the transformer 210 in the example in FIG. 2 and the negative terminal 280 of which is connected to the earth potential 250, a deflection electrode pair 140 or 150 can be brought to an electrical potential that is different from the earth potential 250. The DC voltage source 260 can generate a DC voltage from approximately 100 V to the two-digit kilovolts range. In an alternative embodiment, the center tap 240 of the transformer 210 or the terminals 162 and 167 of the electromagnetic coupling members 160 and 165 is or are connected to the DC voltage prevailing in an electro-optical column of a scanning particle microscope, or the deflection electrode pair 140 and/or 150 are brought to the potential prevailing in the surroundings of the installation location of the beam blanker 100 in the scanning particle microscope.

As an alternative to the embodiment in the form of a transformer 210, the electromagnetic coupling members 160 and 165 can also be embodied in the form of a coupling capacitor (not shown in FIG. 2).

Referring to FIG. 1 again, the exemplary amplifiers 190 and 195 can be realized for example as operational amplifiers or in the form of power amplifiers such as, for instance, a power MOSFET (Metal Oxide Semiconductor Field Effect Transistor).

The voltage sources 175 and 180 generate the AC voltages that are applied to the inputs of the amplifiers 190 and 195. If the voltage sources 175, 180 can generate a sufficiently large voltage amplitude, the amplifiers 190 and 195 can be dispensed with. The phase shifter 185 can shift the phase of the first and second AC voltages relative to one another. The voltage sources 175 and 180 can generate AC voltages having a different frequency, phase and amplitude. Furthermore, the voltage sources 175 and 180 can generate AC voltages having different signal waveforms. As a result, for example, a sinusoidal AC voltage can be applied to the first deflection electrode pair 140 and a sawtooth-like or a ramped AC voltage can be applied to the second deflection electrode pair 150.

The two voltage sources 175 and 180 can generate sinusoidal AC voltages having frequencies right into the three-digit MHz range. Furthermore, the voltage sources 175 and 180 can generate other AC voltage waveforms having similar frequencies that can be amplified by the amplifiers 190 and 195. The voltage sources 175 and 180 or the amplifiers 185 and 190 can generate AC voltages having voltage amplitudes in the three-digit voltage range.

Finally, it is possible to drive the two amplifiers 190 and 195 with one voltage source 175 or 180 (not illustrated in FIG. 1). In this embodiment, i.e. one of the voltage sources 175 or 180 supplies the input signals for the amplifiers 190 and 195, it is likewise advantageous, as illustrated schematically in FIG. 1, to incorporate a phase shifter 185 into one of the two input lines leading to the amplifiers 190 and 195. The phase shifter 185 should be dimensioned such that the phase of the output signal of the voltage source 175 or 180 or of the output signals of the voltage sources 175 and 180 is settable in a continuously variable manner over a range of 0 to $2\pi$. The phase shifter 185 should be able to satisfy this condition over a large frequency range of the output voltage of the voltage source(s) 175, 180. Typically, integrated synthesizer modules that were developed for direct digital synthesis are used for generating the voltage signals. These voltage sources allow both the frequency and the phase of the generated signal to be set.

If the beam blanker 100 is activated, i.e. AC voltages are applied to the deflection electrode pairs 140 and 150, the charged particle beam 125 executes Lissajous figures 118 on the stop 110. This means that the track of the particle beam runs on the stop 110 during the majority of an oscillation period. It is only when the path movement passes through the zero point of the coordinate system, i.e. impinges on the aperture 115 of the stop 110, that a short pulse 135 is generated which impinges on the sample 105 and can be detected by the detector 120.

The beam blanker 100 furthermore comprises a deflection controller 170. The deflection controller 170 controls the first voltage source 175 and the second voltage source 180. To that end, it prescribes for the first voltage source 175 the generation of a first AC voltage having a first frequency, a first phase and a first voltage amplitude. Furthermore, the deflection controller 170 instructs the second voltage source 180 to generate a second AC voltage having a second frequency, a second phase and a second voltage amplitude. Furthermore, the deflection controller 170 sets the phase shift of the phase shifter 185. Moreover, the deflection controller 170 is furthermore designed to set the gains of the amplifiers 190 and 195 (not illustrated in FIG. 1). In addition, the deflection controller 170 sets the detector 120 and receives measurement data from the detector 120. The deflection controller 170 can moreover comprise a computing unit designed to ascertain the paths of the charged particle beam 125 that are caused by the first and second AC voltages applied to the deflection electrode pairs 140 and 150 in the plane of the stop 110. Furthermore, the computing unit can calculate a distance between the path of the charged particle beam 125 and the aperture 115 of the stop 110.

Figure 3:
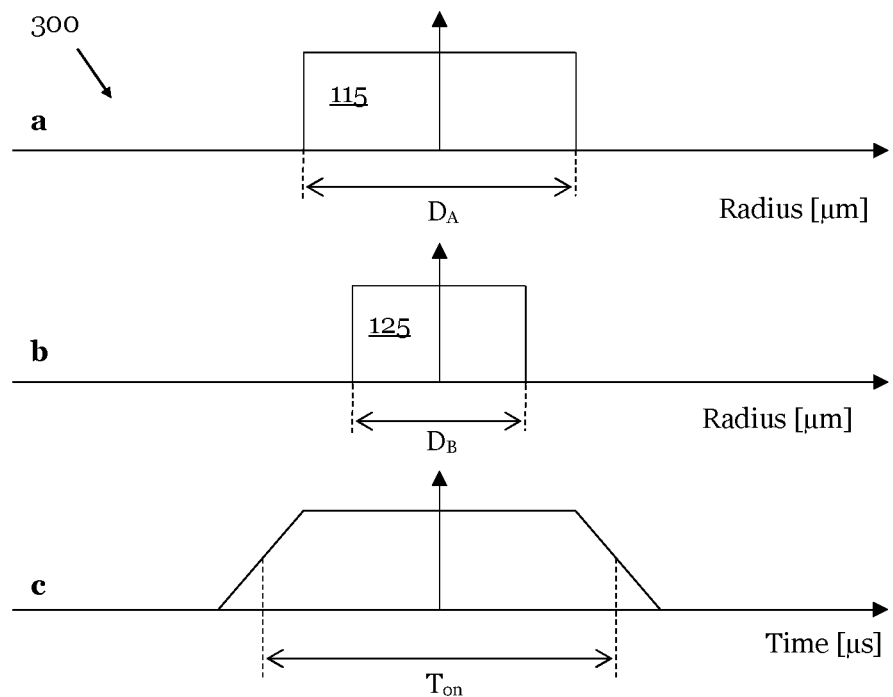
FIG. 3 schematically illustrates the arising of the pulse duration when a charged particle beam sweeps over the aperture of a stop.

The diagram 300 in FIG. 3 schematically shows the arising of a short pulse 135 from a continuous charged particle beam 125 as a result of the aperture 115 of the stop 110 being swept over on account of the deflection of the charged particle beam 125 by the deflection electrode pairs 140, 150 of the beam blanker 100. In the example illustrated in FIG. 3, the aperture 115 of the stop 110 has a circular shape. Sub-figure a of FIG. 3 illustrates a section through the diameter $D_A$ of the opening 115 of the stop 110. The charged particle beam 125 has substantially a rotationally symmetrical flat-top intensity profile having a diameter $D_B$ in a plane perpendicular to the beam axis 130 in the example indicated in FIG. 3. Sub-figure b of FIG. 3 indicates a section through the center of the intensity profile of the charged particle beam 125. In the exemplary illustration presented in sub-figures a and b, the beam diameter $D_B$ comprises approximately 60% of the diameter $D_A$ of the aperture 115.

Upon a voltage being applied to one or both of the deflection electrode pairs 140, 150, the charged particle beam 125 is deflected from the beam direction 130. For the considerations below it is assumed that a sinusoidal AC voltage having an identical voltage amplitude $A=A_x=A_y$, angular frequency $\omega=\omega_x=\omega_y$, and phase $\varphi=\varphi_x=\varphi_y=0$ is applied both to the first deflection electrode pair 140 and to the second deflection electrode pair 150. As a result, the charged particle beam 125 performs a movement on the stop 110 that is given by:

$$x(t)=A\cdot\sin(\omega\cdot t)$$

$$y(t)=A\cdot\sin(\omega\cdot t) \tag{1}$$

Figure 4:
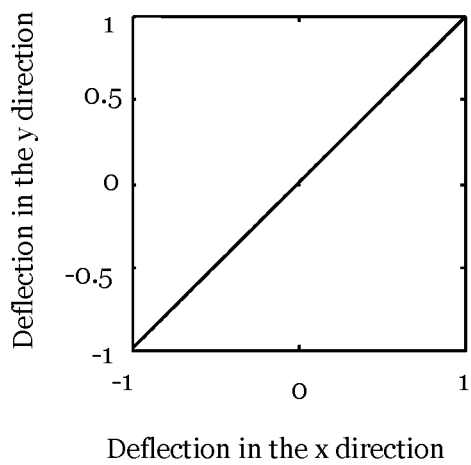
FIG. 4 shows the track of a charged particle beam on a stop in the case of a sinusoidal AC voltage at both blanking electrode pairs, wherein the voltage amplitude, the frequencies and the phases of the AC voltage at both blanking electrode pairs are substantially identical.

Under the given conditions, the charged particle beam 125 performs an oscillation along an angle bi sector in the xy-plane or the plane of the stop 110. For a normalized oscillation, i.e. A=1, the movement of the particle beam 125 in the xy-plane is illustrated in FIG. 4. The velocity at which the charged particle beam 125 performs its path in the xy-plane is then given by:

$$\dot{x}(t)=A\cdot\omega\cdot\cos(\omega\cdot t)$$

$$\dot{y}(t)=A\cdot\omega\cdot\cos(\omega\cdot t) \tag{2}$$

The maximum velocity $v_{max}$ is attained by the movement of the charged particle beam 125 at the zero crossing of the oscillation, i.e. above the aperture 115 of the stop 110:

$$v_{max}=\sqrt{\dot{x}^2(0)+\dot{y}^2(0)}=\sqrt{2}\cdot\omega\cdot A \tag{3}$$

As illustrated in sub-figure c of FIG. 3, the pulse duration $T_{ON}$ is given to a good approximation by the maximum velocity $v_{max}$ and the diameters of the aperture 115 $D_A$ and of the charged particle beam 125 $D_B$:

$$v_{max}=\frac{s}{t}=\frac{D_A+D_B}{T_{ON}}=\sqrt{2}\cdot\omega\cdot A \Rightarrow T_{ON}=\frac{D_A+D_B}{\sqrt{2}\cdot\omega\cdot A} \tag{4}$$

The pulse duration $T_{ON}$ depends on the diameters of the aperture $D_A$ and of the particle beam $D_B$. In particular, the larger of the two diameters determines the minimum pulse duration $T_{ON}$ that can be achieved. It is advantageous for a short pulse duration if $D_A$ and $D_B$ have comparable numerical values. Furthermore, it is advantageous if the following holds true: $D_A \geq D_B$, since as a result the entire beam current is available on the sample.

As can be gathered from equation 4, the pulse duration $T_{ON}$ inversely with the angular frequency ω or the frequency $$f = \frac{\omega}{2\pi} = \frac{1}{T} = \frac{1}{2 \cdot T_P}.$$

The charged particle beam 125 sweeps over the zero crossing or the aperture 115 of the stop 110 twice during the time duration of an oscillation T. In this case, the time duration between two zero crossings and thus the pulse period, the repetition time duration of the pulses or the period duration thereof at the output of the beam blanker 100 is given by:

$$T_P = \frac{T}{2}.$$

Figure 5:
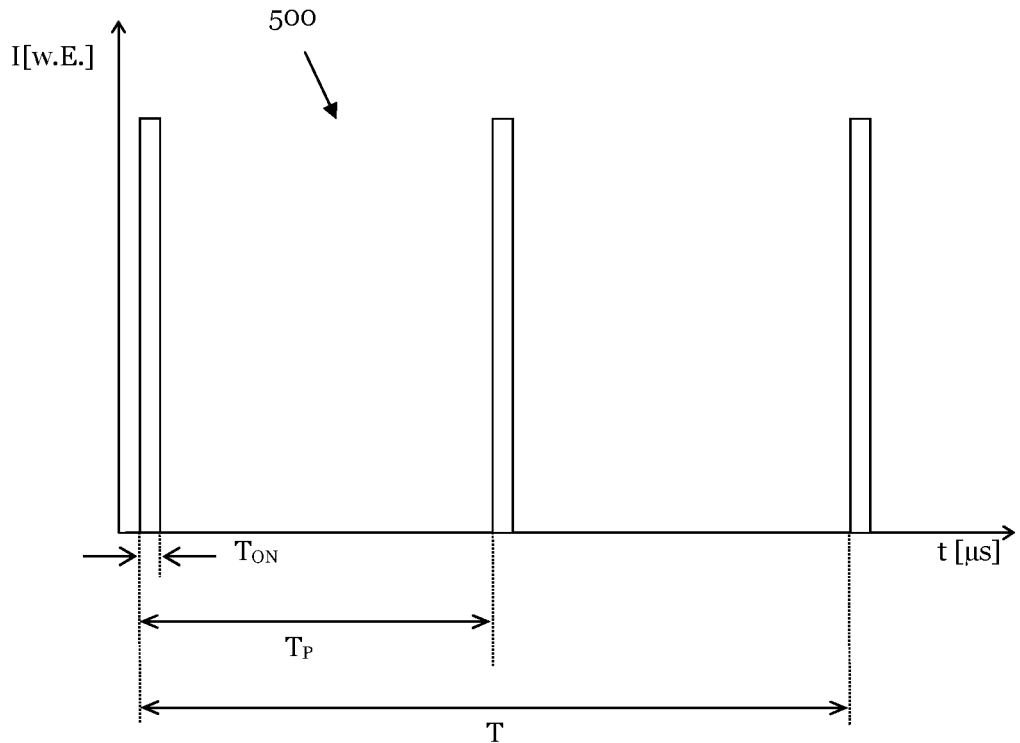
FIG. 5 illustrates, for the sinusoidal AC voltages from FIG. 4, schematically the pulse duration $T_{ON}$, the period duration of the oscillation T and the repetition time duration or the period duration $T_P$ of the pulses at the output of the beam blanker from FIG. 1.

These relationships are illustrated schematically in the diagram 500 in FIG. 5.

The following can furthermore be gathered from equation 4: $T_{ON} \propto f^{-1}$. This means that high frequencies are required in order to generate short pulses 135. A predefined pulse duration $T_{ON}$ thus stipulates the pulse period $T_P$ or the temporal spacing of successive pulses at the output of the beam blanker 100 for a sinusoidal AC voltage at both deflection electrode pairs 140 and 150. This relationship is expressed in the following equation:

$$\omega = \frac{D_A + D_B}{\sqrt{2} \cdot A \cdot T_{ON}} \Rightarrow T_P = \frac{\sqrt{2} \cdot \pi \cdot A \cdot T_{ON}}{D_A + D_B} \quad (5)$$

For the following estimation, the diameters of the aperture 115 and of the charged particle beam 125 are assumed to be identical and 100 μm, i.e. $D_A = D_B = 100$ μm, and the following is assumed for the amplitude of the oscillation: A=5000 μm. If a pulse duration $T_{ON}$=50 ps is then demanded, a period duration of $T_P$=5.5 ns or a frequency ν≈90 MHz then results from equation 5. AC voltages in this frequency range can be applied to the deflection electrode pairs 140 and 150 without major experimental difficulties.

If a phase shift of 90° or π/2 is introduced between the sinusoidal AC voltages applied to the deflection electrodes 140 and 150, then equation 1 changes as follows:

$$x(t) = A \cdot \sin\left(\omega \cdot t + \frac{\pi}{2}\right) = A \cdot \cos(\omega \cdot t) \quad (6)$$
$$y(t) = A \cdot \sin(\omega \cdot t)$$

Figure 6:
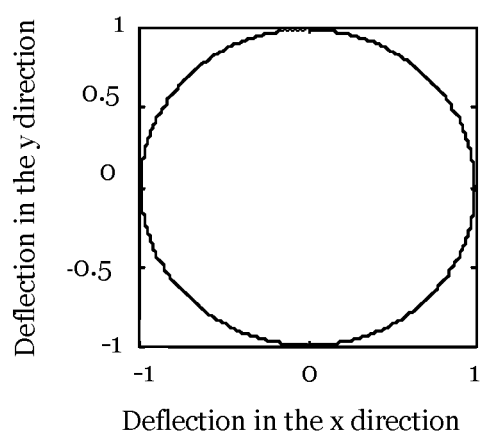
FIG. 6 presents the track of the charged particle beam on the stop of the beam blanker from FIG. 1 if a sinusoidal AC voltage having an identical voltage amplitude is applied to the two blanking electrode pairs, wherein the sinusoidal AC voltage at the two blanking electrode pairs has a phase shift with respect to one another of $\pi/2=90°$.

FIG. 6 represents the path movement performed by the charged particle beam 125 on the stop 110 for equation 6. It is evident from FIG. 6 that the particle beam 125 circulates on a circular path with the angular frequency ω=2π·f around the aperture 115 of the stop 110 without ever sweeping over the aperture 115 of the stop 110. Thus, a phase shift by 90° of the sinusoidal AC voltage applied to one of the deflection electrodes 140 relative to the AC voltage with which the other deflection electrode pair 150 is operated enables the switch-off of the beam blanker 100, that is to say that no pulse of the charged particle beam 125 passes through the aperture 115 of the stop 110. The switch-off of the beam blanker 100 is effected without any change in the power consumption or power loss of the beam blanker 100. This has the advantage that, as a result of a temporary switch-off of the charged particle beam 125 by the beam blanker 100, a temperature drift possibly requiring a recalibration of the beam axis 130 of the charged particle beam 125 will likely not occur.

The switch-off of the pulses 135 of the charged particle beam 125 does not require a phase shift of the two AC voltages applied to the deflection electrodes 140 and 150 of 90°. A phase shift in the angular range of approximately 30°≤φ≤150° is already sufficient to prevent the path movement of the charged particle beam 125 from coming near the aperture 115 of the stop 110. However, a further increase in the angular range leads to a significant increase in the dark current at the output of the beam blanker 100.

Figure 7:
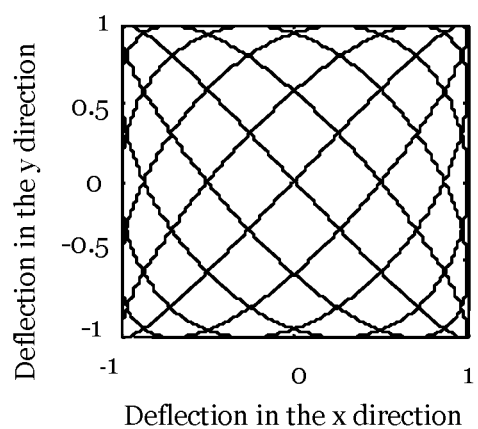
FIG. 7 presents the track of the charged particle beam on the stop of the beam blanker from FIG. 1, wherein a frequency of 100 MHz is present at the blanking electrode pair for the deflection in the x-direction and a frequency of 120 MHz is present at the blanking electrode pair for the deflection in the y-direction.

In important areas of application, for example in mask repair indicated above, it is necessary to be able to set the period duration $T_P$, i.e., the temporal spacing between the impingement of the pulses on a sample, such as from a photolithographic mask, for instance, freely, i.e. substantially without influencing the pulse duration $T_{ON}$. This can be achieved by applying sinusoidal AC voltages having different frequencies to the deflection electrode pairs 140 and 150. FIG. 7 shows the path movement of the charged particle beam 125 on the stop 110 if an AC voltage of $f_x$=100MHz is applied to the deflection electrode pair 140 for the deflection in the x-direction and an AC voltage of $f_y$=120MHz is applied to the deflection electrode pair 150 for the deflection in the y-direction. The pulse repetition time duration or the pulse period $T_P$ can be calculated with the aid of the following equation:

$$T_P = \frac{1}{2 \cdot |f_x - f_y|} \quad (7)$$

In the example given, the pulse period thus rises from 5.5 ns, as discussed in the context of FIG. 4, to now $T_P$=50 ns and thus by almost one order of magnitude.

Figure 8:
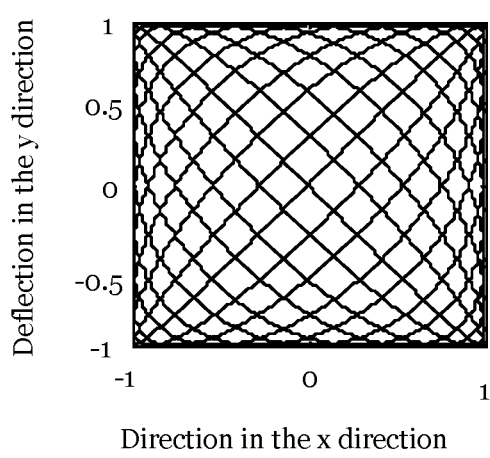
FIG. 8 illustrates FIG. 7 after the frequency for the deflection in the y-direction was reduced from 120 MHz to 110 MHz.

FIG. 8 presents the path movement of the charged particle beam 125 on the stop 110 if an AC voltage of $f_x$=100MHz is applied to the deflection electrode pair 140 for the deflection in the x-direction and an AC voltage of $f_y$=110MHz is applied to the deflection electrode pair 150 for the deflection in the y-direction. The pulse repetition time duration or the pulse period $T_P$ is doubled again compared with the configuration in FIG. 7 to $T_P$=100 ns.

Figure 9:
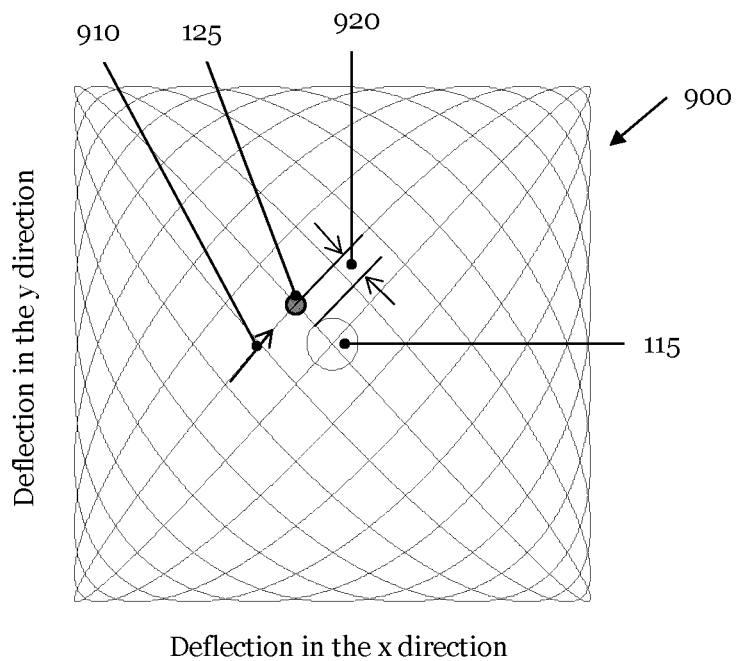
FIG. 9 shows FIG. 8 in an enlarged view, wherein the aperture of the stop of the beam blanker from FIG. 1 and the diameter of the charged particle beam are additionally depicted.

Comparison of FIGS. 7 and 8 reveals that as the difference frequency $\Delta f = f_y - f_x$ of the two AC voltages applied to the deflection electrode pairs 140 and 150 decreases, the paths of the particle beam 125 on the stop 110 become closer. The diagram 900 in FIG. 9 shows FIG. 8 again in an enlarged view, wherein the diameter $D_A$ of the aperture 115 of the stop 110 and the diameter $D_B$ of the charged particle beam 125 are depicted. The arrow 910 symbolizes the direction of the path movement of the particle beam 125 on the stop 110. It is evident from FIG. 9 that when setting the desired pulse duration $T_{ON}$ and the desired pulse period $T_P$ by selecting the frequency f and the difference frequency Δf of the AC voltages applied to the two deflection electrode pairs 140 and 150, care must be taken to ensure that the particle beam 125 sweeps over the aperture 115 of the stop 110 at a sufficient distance 120, such that substantially no charged particles impinge on the sample 105 at unexpected points in time. To put it another way, a pulse 135 having a pulse duration $T_{ON}$ leaves the aperture 115 of the stop 110 during a pulse period $T_P$ and substantially no charged particles leave the stop 110 during the remaining time duration of the pulse period.

For a given diameter $D_A$ of the aperture 115 of the stop and a given diameter $D_B$ of the intensity profile of the charged particle beam 125, a prescription for the pulse duration $T_{ON}$ stipulates a first frequency $f_1$ for a first AC voltage. It is possible to arbitrarily select the difference frequency $\Delta f$ and thus set the pulse period $T_P$ as long as substantially during the selected pulse period $T_P$ no parasitic pulses occur, that is to say that outside the pulse duration $T_{ON}$ of the pulse 135 substantially no charged particles leave the beam blanker 100 through the aperture 115 of the stop 110.

Figure 10:
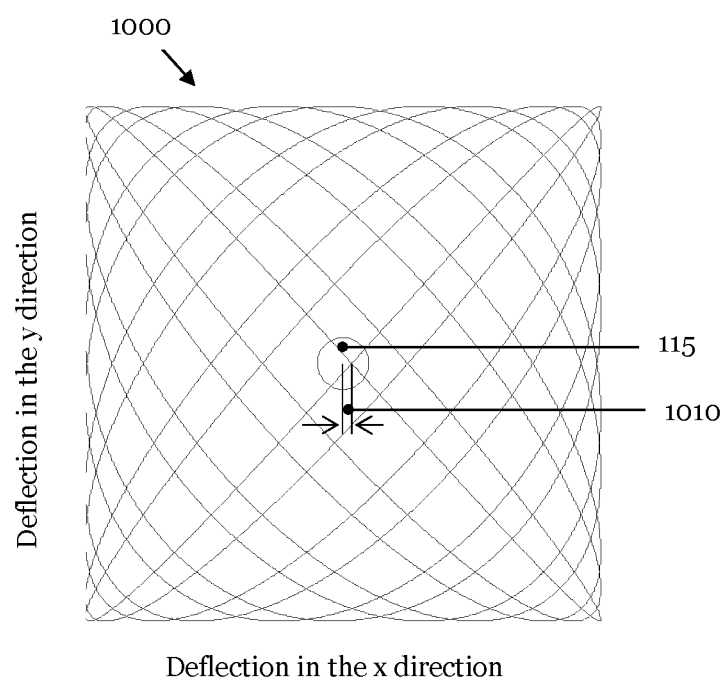
FIG. 10 repeats FIG. 8, wherein the two frequencies for the deflection in the x- and y-directions additionally have a phase shift of $\Delta\varphi=\pi/9$.

The diagram 1000 in FIG. 10 once again represents FIG. 8, wherein the two AC voltages of the deflection electrode pairs 140 and 150 have a phase difference $\Delta \varphi = \pi/9$. That is to say that equation 6 is modified:

$$x(t) = A \cdot \cos(\omega \cdot t) \qquad (8)$$
$$y(t) = A \cdot \sin\left(\omega \cdot t + \frac{\pi}{9}\right)$$

The phase difference shifts the track of the particle beam 125 by a distance 1010 relative to the center of the aperture 115 of the stop 110. Conversely this means that a phase shift of the AC voltages applied to the two deflection electrode pairs 140 and 150 enables the track to be aligned relative to the center of the aperture 115 of the stop 110. Since this alignment can be achieved by use of a pure phase shift without additional DC voltage portions, it is possible to align the track of the particle beam 125 relative to the center of the aperture 115 even given the presence of the electromagnetic coupling members 160 and 165 of the beam blanker 100.

As already explained above, when a small difference frequency $\Delta f = f_2 - f_1 = f_y - f_x$ of the two sinusoidal AC voltages is selected, the stop 110 is occupied very densely by trajectories of the particle beam 125. As a result, the particle beam 125 can come near the aperture 115 of the stop 110 and partly sweep over the latter. This can be prevented by decreasing the diameter $D_A$ of the aperture 115 and the diameter $D_B$ of the particle beam 125. However, physical limits are imposed on both of these. In addition, decreasing $D_A$ and $D_B$ makes it more difficult to align the particle beam 125 with respect to the beam axis 130.

This problem can be alleviated in a second way. To that end, one of the two sinusoidal AC voltages having the frequencies $f_1$ and $f_2$ is replaced by a ramp signal having a settable period duration. It is also possible for one of the two sinusoidal AC voltages applied to the deflection electrode pairs 140 and 150 to be replaced by individual voltage pulses that are applied to one of the deflection electrode pairs 140 or 150. The individual voltage pulses, for their part, trigger short pulses 135 of charged particles at the output of the beam blanker 100, i.e. downstream of and behind the stop 110 thereof.

Figure 11:
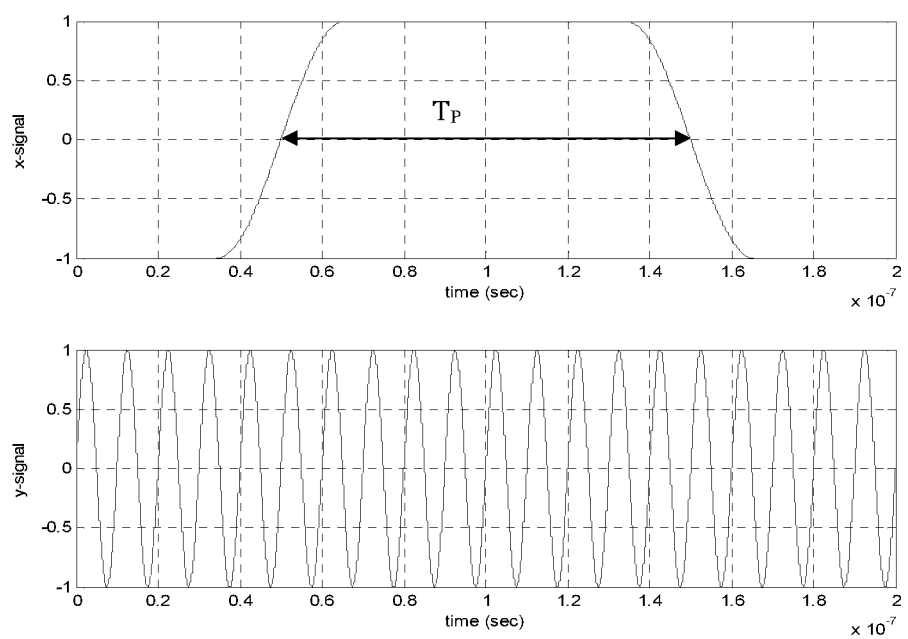
FIG. 11 presents, in the upper sub-figure, the voltage as a function of time at the blanking electrode pair for the deflection in the x-direction and, in the lower sub-figure, the time profile of a sinusoidal oscillation at the blanking electrode pair for the deflection in the y-direction.

This principle is explained below on the basis of an example in which the sinusoidal AC voltage applied to the deflection electrode pair 140 for the deflection in the x-direction is replaced by a ramp signal. The upper sub-figure of FIG. 11 shows the ramp signal of the deflection electrode pair 140 for the deflection in the x-direction as a function of time. The lower sub-figure presents a sinusoidal oscillation having a period duration of 10 ns, which is present at the deflection electrode pair 150 for the deflection in the y-direction. In this example, the deflection in the y-direction oscillates for approximately 40 ns on one side of the deflection range in the x-direction and then sweeps over the entire deflection range in the x-direction including the aperture 115 in approximately 20 ns so as subsequently to perform a sinusoidal oscillation in the y-direction at the other end of the deflection range in the x-direction for approximately 80 ns. The sinusoidal oscillation in the y-direction then returns again to the end position of the deflection range of the x-deflection, wherein the charged particle beam 125 sweeps over the aperture 115 of the stop 110. As indicated in the upper sub-figure of FIG. 11, the ramp signal at the blanking electrode pair 140 in the x-direction has a pulse period of $T_P = 100$ ns.

Figure 12:
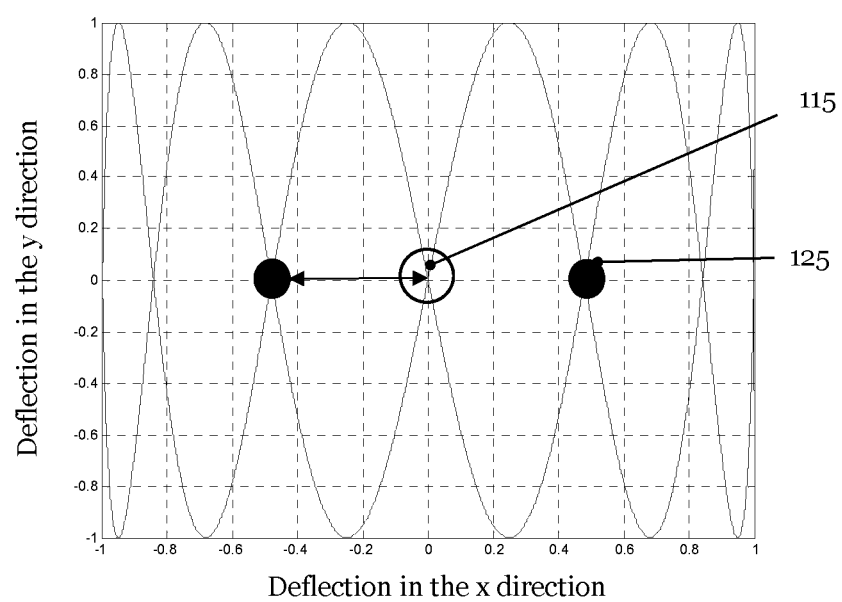
FIG. 12 shows the track of the charged particle beam on the stop of the beam blanker from FIG. 1 for the voltage profiles at the blanking electrode pairs from FIG. 11.

FIG. 12 illustrates the time functions x(t) and y(t) of the path movement of the particle beam 125 from FIG. 11 as deflection in the xy-plane of the stop 110. During the movement of the charged particle beam 125 in the x-direction from one end of the deflection range in the x-direction to the other end of the deflection range in the x-direction, it must be ensured that the charged particle beam 125 passes through the aperture 115 of the stop 110 only once and performs the further movements of the particle beam 125 during the time duration of the voltage pulse in the x-direction at a sufficient distance from the aperture 115 such that substantially no charged particles can inadvertently pass through the aperture 115. This is ensured if the particle beam 125 in the x-direction during half an oscillation duration of the sinusoidal oscillation in the y-direction covers a distance that is greater than the sum of the diameters of the aperture $D_A$ and of the particle beam $D_B$, or expressed as a formula:

$$v_{x,max} > \frac{D_A + D_B}{T/2} = \frac{D_A + D_B}{T_P} = \frac{(D_A + D_B)^2}{\pi \cdot A \cdot T_{ON}} \qquad (9)$$

According to equation 2, the maximum velocity of the particle beam 125 is at the zero crossing of the oscillation, i.e. in proximity to the aperture:

$$\dot{y}(0) = v_{y,max} = A \cdot \omega_y = \frac{D_A + D_B}{T_{ON}}, \qquad (10)$$

wherein the adapted equation 5 was used in the last step. From equations 9 and 10, the following arises for the ratio of the maximum velocities of the movement of the charged particle beam 125 in the x- and y-directions:

$$\frac{v_{x,max}}{v_{y,max}} = \frac{D_A + D_B}{\pi \cdot A} \qquad (11)$$

Since the following must hold true for the amplitude A of the oscillation in the y-direction: $A > D_A + D_B$, this embodiment merely requires a maximum velocity of the voltage ramp in the x-direction that is lower by approximately the factor of 3 compared with the above-discussed exemplary embodiment having two sinusoidal AC voltages.

The above-discussed embodiments of a beam blanker 100 have the problem that the particle pulses 135 that leave the beam blanker 100 through the aperture 115 of the stop 110 are deflected with respect to the beam axis 130. If the beam blanker 100 is inserted into a scanning particle microscope that is used for analysing a sample, the beam blanker 100 corrupts the recorded measurement data, or the lateral spatial resolution of the particle beam 125 is reduced. This problem can be reduced by minimizing the diameter $D_A$ of the aperture 115 of the stop 110.

Figure 13:
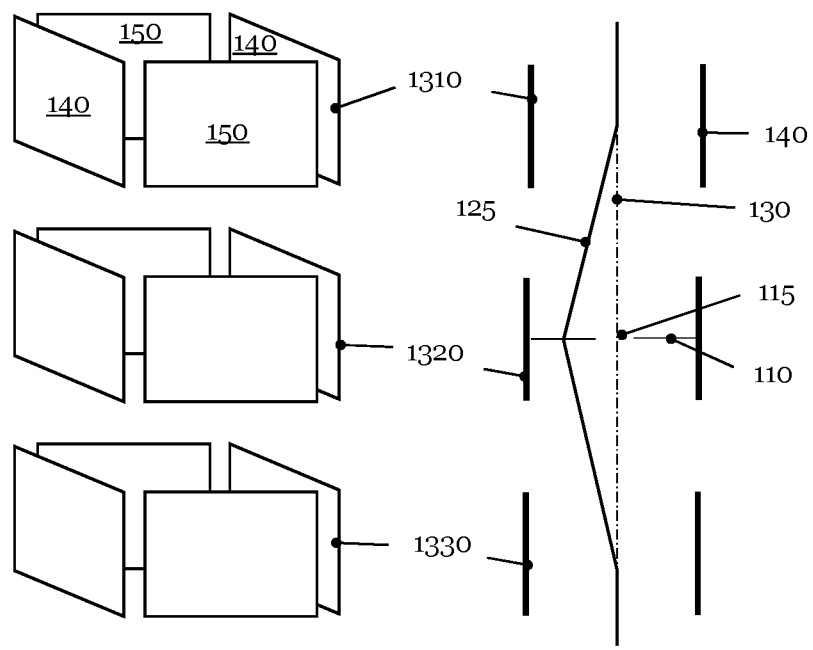
FIG. 13 schematically illustrates an arrangement of blanking electrode pairs which make it possible to compensate for deviations of the pulses generated by the beam blanker from FIG. 1 from the beam axis.

The occurrence of this problem can be avoided by the pulses of the charged particle beam 125 being aligned again along the beam axis 130. This is illustrated schematically in FIG. 13. As shown in FIG. 13, three deflection electrode pairs 1310, 1320, 1330 arranged one behind another along the beam axis 130 are used for this purpose. Said deflection electrode pairs 1310, 1320, 1330 are illustrated in perspective view in the left-hand sub-figure. The right-hand sub-figure shows a section through the center of the left-hand sub-figure. In addition, the right-hand sub-figure illustrates the beam axis 130, the stop 110 having the aperture 115 and schematically the path of the charged particle beam 125 through the three deflection electrode pairs 1310, 1320, 1330. The three deflection electrode pairs 1310, 1320, 1330 are preferably arranged in a manner spaced equidistantly along the beam axis 130.

The first deflection electrode pairs 1310 can be the deflection electrode pairs 140 and 150 of the beam blanker 100. These deflect the charged particle beam 125 from the beam axis 130, as described above. The stop 110 is arranged at the center of the height of the second blanking electrode pairs 1320. The second blanking electrode pairs 1320 deflect the pulses 135 of the charged particle beam 125 that pass through the aperture 115 of the stop 110 once again in the direction of the beam axis 130. For this purpose, either it is necessary for the deflection electrodes of the second blanking electrode pair 1320 to have a height double that of the deflection electrode pairs 1310 and 1330 (not shown in FIG. 13). Alternatively, given identical deflection electrode pairs 1310, 1320 and 1330, the voltage at the second blanking electrode pair 1320 is selected to have a magnitude double that of the deflection voltages at the first 1310 and the third blanking electrode pairs 1330. The third blanking electrode pairs 1330 are preferably structurally identical to the first blanking electrode pairs 1310. They align the pulses 135 of the charged particle beam 125 once again on the beam axis 130.

Figure 14:
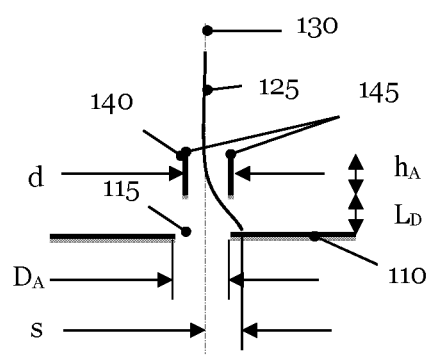
FIG. 14 schematically illustrates the path of a charged particle beam in a beam blanker.

FIG. 14 schematically shows the dependence of the deflection of the charged particle beam 125 in the electric field of a deflection electrode pair 140 on various parameters. The height $h_A$ of the deflection electrodes 145 of the deflection electrode pair 140 is designated by $h_A$ in FIG. 14 and their distance is d. The absolute value of the electric field strength E is then given by the voltage $U_A$ applied to deflection electrodes 145 of the deflection electrode pair 140 and the distance d between the deflection electrodes 145: $E=U_A/d$. The time duration in which the electric field E can act on the charged particles of the particle beam 125 is dependent on the residence time or the transit time $t_{tr}$ of the charged particles in the electric field. The transit time is determined by the acceleration voltage $U_B$ to which the particles of the charged particle beam 125 were exposed before entering the electric field generated by the deflection electrode pair 140. After leaving the electric field, the charged particles maintain the movement component acquired in the electric field, said component being perpendicular to the original movement, on their way $L_D$ to the stop 110 or the aperture 115 of the stop. The deflection s perpendicular to the beam axis 130 is thus given as follows:

$$s = \frac{1}{2} \frac{U_A \cdot h_A}{d \cdot U_B} \left( \frac{h_A}{2} + L_D \right) \qquad (12)$$

It can be gathered from equation 12 that the deflection in the electric field of the deflection electrode pair 140 is linearly dependent on the voltage applied to the deflection electrodes 145 and rises with the square of the height $h_A$ of the deflection electrodes and varies inversely proportionally with the distance between the deflection electrodes of the deflection electrode pair 140. In order to achieve a large deflection s, according to equation 12 the height $h_A$ of the deflection electrodes 145 should be made as large as possible.

On the other hand, the bandwidth of the beam blanker 100 is limited by the transit time $t_{tr}$ required by the charged particles to pass the deflection electrodes 145, 155 of the deflection electrode pairs 140, 150. This means that a predefined bandwidth and in association therewith a maximum possible transit time $t_{tr}$ restrict the height $h_A$ of the deflection electrodes 145, 155 to:

$$h_A < \sqrt{\frac{2 \cdot U_B \cdot q}{m}} \cdot t_{tr}, \qquad (13)$$

where m denotes the mass and q the charge of the charged particles. If equation 13 is inserted into equation 12, the voltage U to be applied to the deflection electrodes 145, 155 can be estimated. It may be technically complex to generate high-frequency AC voltages having a corresponding voltage amplitude. Therefore, it may be expedient to divide the required deflection s of the charged particle beam 125 perpendicular to the beam axis 130 among a plurality of deflection electrode pairs 140, 150 arranged sequentially in the beam direction. Said deflection electrode pairs should then be driven with a time-delayed AC voltage in order to compensate for the transit time of the charged particle beam 125 between the deflection electrode pairs arranged one behind another.

The table below lists the parameters of the application example discussed in the fifth part:

| Symbol: | Numerical value: | Note: |
| --- | --- | --- |
| $D_A$ | 0.1 mm | Aperture diameter |
| $D_B$ | 0.1 mm | Beam diameter |
| $U_B$ | 5000 V | Acceleration voltage |
| $f_x$ | 100 MHz | First AC voltage frequency |
| $f_y$ | 110 MHz | Second AC voltage frequency |
| $T_{ON}$ | 85.6 ps | Pulse duration (cf. equ. 4) |
| $T_P$ | 50 ns | Period duration (cf. equ. 7) |
| $h_A$ | 5 cm | Height of the deflection electrodes |
| $L_D$ | 1 cm | Distance between deflection electrodes and stop |
| A | 2.5 mm | Amplitude of the deflection |
| $U_A$ | 71.4 V | Voltage of the deflection electrodes |
| D | 5 mm | Distance between the deflection electrodes (cf. equ. 12) |
| $t_{tr}$ | $2.8 \cdot 10^{-17}$ s | Transit time through deflection electrodes (cf. equ. 13) |

In the example discussed, the transit time is more than eight orders of magnitude shorter than the period durations, the frequencies $f_x$ and $f_y$ driving the deflection of the charged particle beam 125, and thus does not constitute a problem.

A modified scanning electron microscope (SEM, Scanning Particle Microscope) 1500 is described below, a beam blanker 100 being incorporated into said microscope. However, it is not necessary to insert the beam blanker 100 into a scanning electron microscope 1500, rather the beam blanker 100 can be arranged in an arbitrary scanning particle microscope (not shown in FIG. 15). In particular, the beam blanker 100 can be inserted into an ion beam apparatus or an FIB (Focussed Ion Beam) apparatus (not illustrated in FIG. 15).

Figure 15:
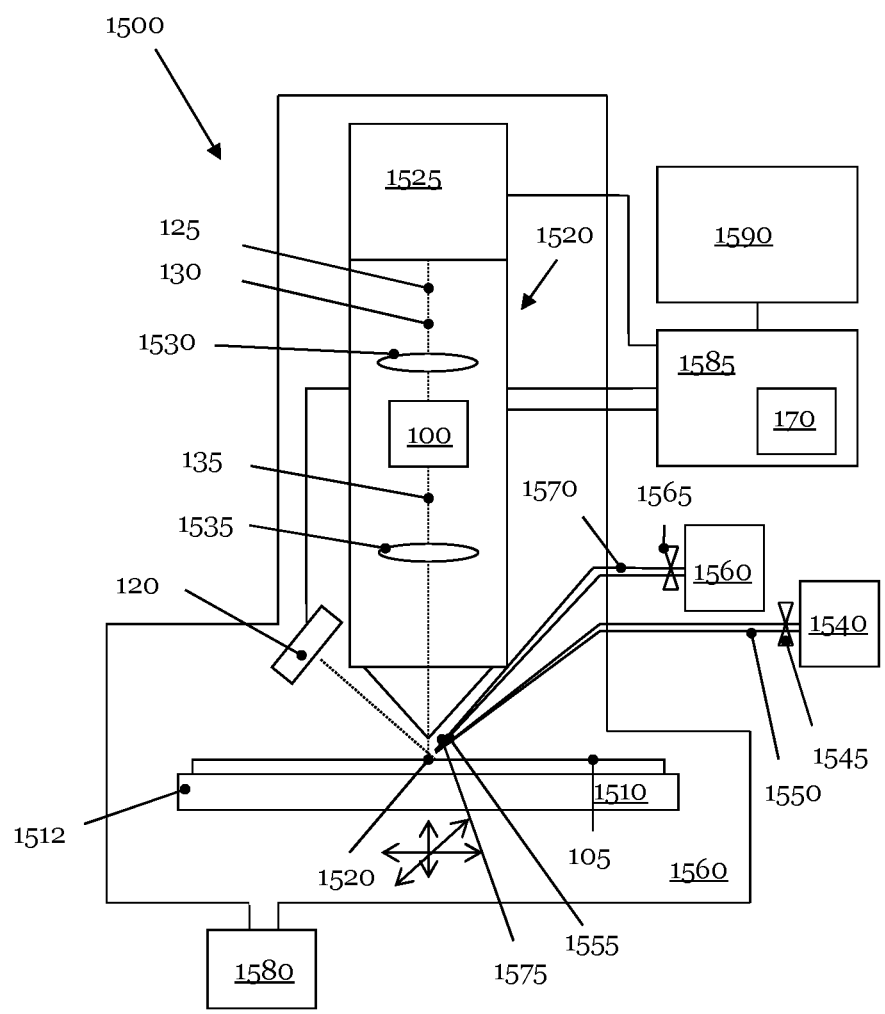
FIG. 15 shows a section through a scanning particle microscope into which the beam blanker from FIG. 1 is incorporated.

FIG. 15 shows a schematic section through some important components of the SEM 1500. A sample 105 to be examined is fixed on a sample stage 1510. This can be done for example by suction exerted on the sample 105 with a reduced pressure by use of the sample stage 1510 or by an electrostatic interaction between the sample stage 1510 and an electrically conductive rear side of the sample 105.

The sample 105 may be an arbitrary microstructured component or structural part. By way of example, the sample 105 may comprise a transmissive or a reflective photomask and/or a template for nanoimprint technology. Furthermore, the scanning electron microscope 1500 can be used for examining for example an integrated circuit, a microelectromechanical system (MEMS) and/or a photonic integrated circuit.

As symbolized by arrows in FIG. 15, the sample stage 1510 can be moved by a positioning system 1512 in three spatial directions relative to the point of incidence 1520 of the pulses 135 of the charged particle beam 125. In the example in FIG. 15, the positioning system 1512 is embodied in the form of a plurality of micromanipulators. An alternative embodiment of the positioning system 1512 might be piezo-actuators. The positioning system 1512 is controlled by signals of a control device 1585.

In the exemplary scanning electron microscope 1500, an electron gun 1525 generates an electron beam 125, which moves along the beam axis 130 in the direction of the sample 105. A first electro-optical lens 1530 arranged in the column 1520 focuses the electron beam 125 onto the beam blanker 100. A second electro-optical lens 1535 focuses the pulses 135 of the electron beam 125 that leave the beam blanker 100 onto the point of incidence 1520 of the pulses 135 on the sample 105. Further imaging elements of the column 1520 of the SEM 1500, which are suppressed in FIG. 15 for reasons of clarity, can furthermore scan the pulses 135 of the electron beam 125 over the sample 105.

The electrons backscattered from the electron pulses 135 and the secondary electrons generated by the electron pulses 135 are registered by the detector 120. The detector 120 is controlled by the control device 1585. Furthermore, the control device 1585 of the SEM 1500 receives the measurement data of the detector 120. The control device 1585 can generate images from the measurement data, said images being represented on a monitor 1590. The control device 1585 comprises the deflection controller 170 of the beam blanker 100. In an alternative embodiment, the deflection controller 170 is configured as a separate unit that exchanges data with the control device 1585 of the SEM 1500.

Besides the analysis of the sample 105, the pulses 135 of the electron beam 125 can also be used for processing defects of a sample 105. Defects of a sample 105 may be, for example, absent material and/or excess absorber material of pattern elements of photolithographic masks. In order to process the sample 105, arranged on the sample stage 1510, i.e. to repair the defects of said sample, the modified scanning electron microscope 1500 comprises at least two supply containers 1540 and 1560 for two different processing gases. The first supply container 1540 stores a first precursor gas, in particular a first carbon-containing precursor gas. By way of example, a metal carbonyl, for instance chromium hexacarbonyl or a main group element alkoxide, such as TEOS, for instance, can be stored in the first supply container 1540. With the aid of the precursor gas stored in the first supply container 1540, absent material, for example absent absorber material of a photomask, can be deposited on the sample 105.

The second supply container 1560 stores an etching gas, which makes it possible to perform an electron-beam-induced etching process. Excess material can be removed from the sample 105 with the aid of an electron-beam-induced etching process. An etching gas can comprise for example xenon difluoride ($XeF_2$), chlorine ($Cl_2$), oxygen ($O_2$), ozone ($O_3$), water vapour ($H_2O$), hydrogen peroxide ($H_2O_2$), dinitrogen monoxide ($N_2O$), nitrogen monoxide (NO), nitrogen dioxide ($NO_2$), nitric acid ($HNO_3$), ammonia ($NH_3$) or sulfur hexafluoride ($SF_6$).

If necessary, the SEM 1500 can comprise further supply containers in which further processing gases are stored. These are not illustrated in FIG. 15 for reasons of clarity.

Each of the supply containers 1540 and 1560 has its own control valve 1545 and 1565 in order to supervise or control the amount of the corresponding gas that is provided per unit time, i.e. the gas volumetric flow at the location 1520 of the incidence of the pulses 135 of the electron beam 125 on the sample 105. The control valves 1545 and 1565 are controlled and supervised by the control device 1585. The partial pressure ratios of the gases provided at the processing location 1520 can thus be set in a wide range.

Furthermore, in the exemplary modified scanning electron microscope 1500 in FIG. 15, each supply container 1540, 1560 has its own gas feedline system 1550 and 1570, which ends with a nozzle 1155, 1575 in the vicinity of the point of incidence 1520 of the pulses 135 of the electron beam 125 on the sample 105. In an alternative embodiment (not represented in FIG. 15), a gas feed line system is used to bring a plurality or all of the processing gases in a common stream onto the surface of the sample 105.

The supply containers 1540 and 1560 can have their own temperature setting element and/or control element, which enable both cooling and heating of the corresponding supply containers 1540 and 1560. This makes it possible to store and in particular provide the carbon-containing precursor gas(es) and/or the etching gas(es) at the respectively optimum temperature (not shown in FIG. 15). Furthermore, the feed line systems 1550 and 1570 can comprise their own temperature setting elements and/or temperature control elements in order to provide all the processing gases at their optimum processing temperature at the point of incidence 1520 of the pulses 135 of the electron beam 125 on the sample 105 (likewise not indicated in FIG. 15). The control device 1585 can control the temperature setting elements and the temperature control elements both of the supply containers 1540, 1560 and of the gas feed line systems 1550, 1570.

The modified combination apparatus 1500 illustrated in FIG. 15 can be operated under ambient conditions or in a vacuum chamber 1560. Implementing the method explained above necessitates a reduced pressure in the vacuum chamber 1560 relative to the ambient pressure. For this purpose, the SEM 1500 in FIG. 15 comprises a pump system 1580 for generating and for maintaining a reduced pressure required in the vacuum chamber 1560.

Figure 16:
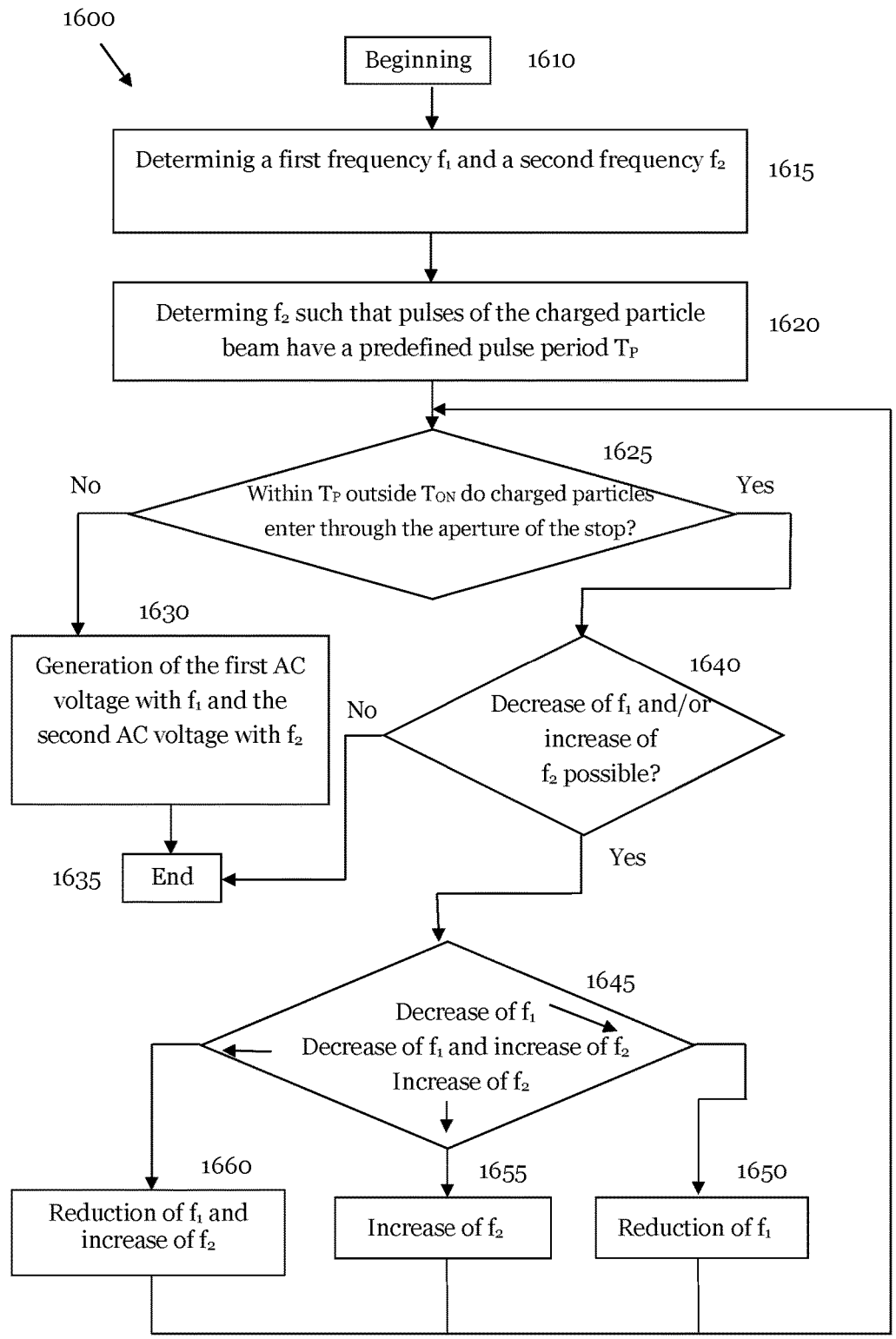
FIG. 16 shows a flow diagram of the method for setting the pulse duration and the pulse period for the beam blanker from FIG. 1.

Finally, FIG. 16 presents a flow diagram 1600 for implementing the above-described method for generating short pulses 135 from a continuous beam of charged particles, wherein the pulse period $T_P$, i.e. the time between the incidence of successive pulses 135, is settable largely independently of the pulse duration $T_{ON}$. The method begins in block 1610. In step 1615, the deflection controller 170 of the beam blanker 100 determines a first frequency $f_1$ of a first AC voltage and a second frequency $f_2$ of a second AC voltage. In step 1620, the deflection controller 170 determines a second frequency $f_2$ of the second AC voltage such that the pulses of the charged particle beam 125 have a predefined pulse period $T_P$.

In decision block 1625, the deflection controller 170 of the beam blanker 100 determines whether during the predefined pulse period $T_P$ outside the time span $T_{ON}$ of the pulse 135 charged particles pass through the aperture 115 of the stop 110. To that end, the deflection controller 170 of the beam blanker 100 or the control device 1585 of the scanning particle microscope 1500 ascertains the tracks 118 or the path movement 118 of the charged particle beam 125 on the stop 110. From said tracks 118, the deflection controller 170 calculates the minimum distance(s) between the aperture 115 of the stop 110 and the charged particle beam 125 or the intensity profile thereof. On the basis of the minimum distance(s) 920, the deflection controller 170 decides whether one or a plurality of parasitic pulses occur within the predefined pulse period, i.e. whether within the pulse period $T_P$ outside the pulse duration $T_{ON}$ substantially charged particles leave the beam blanker 100 beam-downstream through the aperture 115.

If this is not the case, the deflection controller 170 instructs the first voltage source 175 and the second voltage source 180 to generate AC voltages having the frequencies $f_1$ and $f_2$, and the method ends in block 1635.

However, if in decision block 1625 it is decided that one or a plurality of parasitic pulses should be expected, i.e. charged particles pass through the aperture 115 of the stop in a detectable number outside the time span $T_{ON}$ of the pulse but within the pulse period $T_P$, the method advances to the decision block 1640. The decision block 1640 involves determining whether deductions can be made to the prescriptions regarding the pulse duration $T_{ON}$ and/or the pulse period $T_P$. If this is not possible, the method ends in block 1635.

If this is possible, however, the method advances to decision block 1645, which involves establishing whether the frequency $f_1$ of the first AC voltage is reduced. The pulse duration $T_{ON}$ of the pulses 135 of the beam blanker 100 is reduced as a result. If this is possible, in block 1650 the frequency $f_1$ is reduced and the method jumps back to decision block 1625.

Alternatively, decision block 1645 involves ascertaining whether the frequency $f_2$ of the second AC voltage is increased. The pulse period $T_P$, i.e. the spacing of successive pulses 135, is thus reduced. In the next step 1655, the increase of the frequency $f_2$ is then carried out and the method jumps back to decision block 1625.

As a further alternative, decision block 1645 can involve determining both to reduce the frequency $f_1$ of the first AC voltage and to increase the frequency $f_2$ of the second AC voltage. If this option is selected in decision block 1645, both a reduction of $f_1$ and an increase of $f_2$ are carried out in step 1660. With the new frequency values for the AC voltages the method then jumps back to decision block 1625.

The decisions of the decision block 1645 can be taken automatically by the deflection controller 170, for example on the basis of the planned application. It is also possible to interrogate the decisions by use of user inputs. This can be carried out for example with the aid of the monitor 1590 configured in the form of a sensor screen.

The changes in frequency of the first and second AC voltages can be carried out as a percentage of the ascertained frequencies $f_1$ and $f_2$. Alternatively, the changes in frequency can be carried out in the deflection controller 170 by use of fixedly set or selectable fixed frequency steps, for example 1 MHz, 2 MHz, 5 MHz or 10 MHz.

In some implementations, a computer system can perform various computations described above, such as determining a first frequency for a first AC voltage for application to a first deflection element, and determining a second frequency for a second AC voltage for application to a second deflection element. The computer system can include one or more processors and one or more computer-readable media (e.g., RAM, ROM, SDRAM, hard disk, optical disk, and flash memory). The one or more processors can perform various calculations described above. The calculations can also be implemented using application-specific integrated circuits (ASICs). The term "computer-readable medium" refers to a medium that participates in providing instructions to a processor for execution, including without limitation, non-volatile media (e.g., optical or magnetic disks), and volatile media (e.g., memory) and transmission media. Transmission media includes, without limitation, coaxial cables, copper wire, fiber optics and free space. The memory can include any type of memory, such as RAM, ROM, SDRAM, and flash memory.

The features described above can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., C, Java), including compiled or interpreted languages, and it can be deployed in any form, including as a stand-alone program or as a module, component, subroutine, a browser-based web application, or other unit suitable for use in a computing environment.

Suitable processors for the execution of a program of instructions include, e.g., general purpose microprocessors, special purpose microprocessors, digital signal processors, single-core or multi-core processors, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM, DVD-ROM, and Blu-ray BD-ROM disks. The processor and the memory can be supplemented by, or incorporated in, ASICs (application-specific integrated circuits).

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Thus, particular embodiments of the subject matter have been described. Other embodiments are within the scope of the following claims. In some cases, the actions recited in the claims can be performed in a different order and still achieve desirable results.

What is claimed is:

1. A beam blanker for a scanning particle microscope for blanking a charged particle beam having a beam axis, along which charged particles propagate before entering the beam blanker, wherein the beam blanker comprises:
   a. at least one stop having an aperture, through which the charged particle beam can pass;
   b. at least one first and one second deflection element, which are each configured to deflect the particle beam from the beam axis in a first and a second direction, respectively, upon a voltage being present; and
   c. a deflection controller configured to apply a first AC voltage having a first frequency to the first deflection element and a second AC voltage having a second frequency to the second deflection element, wherein the deflection controller sets a difference between the first frequency and the second frequency such that pulses of the charged particle beam have a predefined pulse period and during the pulse period outside the pulse duration substantially no charged particles pass through the aperture of the stop, and wherein the settable difference between the first frequency and the second frequency is determined by a size of the aperture of the stop, a diameter of the charged particle beam and the frequencies of the first or second AC voltage.

2. The beam blanker according to claim 1, further comprising a phase shifter configured to vary a phase of the first AC voltage relative to the phase of the second AC voltage.

3. The beam blanker according to claim 1, wherein the first deflection element and the second deflection element are at a substantially identical distance from the aperture of the stop.

4. The beam blanker according to claim 1, wherein the first deflection element comprises a first deflection electrode pair, the deflection electrodes of which are arranged substantially parallel to the beam axis on both sides of the particle beam, and/or wherein the second deflection element comprises a second deflection electrode pair, the deflection electrodes of which are arranged substantially parallel to the beam axis on both sides of the particle beam.

5. The beam blanker according to claim 4, wherein the deflection electrodes comprise rectangular printed circuit boards having a width of 0.1 mm to 100 mm, preferably 0.5 mm to 20 mm, more preferably 1 mm to 10 mm, and most preferably 2 mm to 5 mm, and/or having a height of 1 mm to 100 mm, preferably 3 mm to 70 mm, more preferably 5 mm to 50 mm, and most preferably 10 mm to 30 mm.

6. The beam blanker according to claim 4, wherein the deflection electrodes of a deflection electrode pair are at a distance of 0.1 mm to 100 mm, preferably 0.5 mm to 20 mm, more preferably 1 mm to 10 mm, and most preferably 2 mm to 5 mm.

7. The beam blanker according to claim 4, wherein the first deflection electrode pair and the second deflection electrode pair form an angle of substantially 90°.

8. The beam blanker according to claim 1, wherein the first AC voltage comprises a sinusoidal AC voltage and the second AC voltage comprises a ramped AC voltage.

9. The beam blanker according to claim 1, wherein the at least one stop is configured to absorb $\geq 98\%$, preferably $\geq 99\%$, more preferably $\geq 99.5\%$, most preferably $\geq 99.9\%$, of the charged particle beam.

10. The beam blanker according to claim 1, further comprising: at least one electromagnetic coupling member for the potential-free connection of a first or a second AC voltage to the first deflection element or the second deflection element, and wherein the electromagnetic coupling member is further configured to superimpose a selectable DC voltage on the first or second AC voltage.

11. A beam blanker for a scanning particle microscope for blanking a charged particle beam having a beam axis, along which charged particles propagate before entering the beam blanker, wherein the beam blanker comprises:
   a. at least one stop having an aperture, through which the charged particle beam can pass;
   b. at least one deflection element configured to deflect the particle beam from the beam axis upon a voltage being present;
   c. an electromagnetic coupling member for the potential-free connection of an AC voltage to the at least one deflection element;
   d. wherein the electromagnetic coupling member is further configured to superimpose a selectable DC voltage on the AC voltage.

12. The beam blanker according to claim 10, wherein the electromagnetic coupling member comprises a transformer.

13. A scanning particle microscope having a beam axis, along which a charged particle beam propagates, comprising:
   a. a particle source for generating the charged particle beam;
   b. at least one electro-optical lens for imaging the charged particle beam;
   c. a beam blanker according to claim 1; and
   d. a sample stage for holding and/or positioning a sample with respect to the charged particle beam.

14. A method for setting a pulse duration and a pulse period of pulses of a charged particle beam in a beam blanker for a scanning particle microscope, wherein the beam blanker comprises: at least one stop having an aperture, through which the charged particle beam can pass; at least one first and one second deflection element, which are configured to deflect the particle beam from the beam axis in a first and a second direction, respectively, upon a voltage being present, the method comprising the following steps:

a. determining a first frequency for a first AC voltage for application to the first deflection element;
b. determining a second frequency for a second AC voltage for application to the second deflection element; and
c. wherein determining the second frequency is carried out such that the pulses of the charged particle beam have a predefined pulse period and during the pulse period outside the pulse duration substantially no charged particles pass through the aperture of the stop, and wherein the predetermined pulse period is determined by the aperture of the stop, a diameter of the charged particle beam and the frequencies of the first or second AC voltage.

15. The method according to claim 14, further comprising the step of: determining a maximum length of the pulse period by minimizing a settable difference frequency between the first frequency of the first AC voltage and the second frequency of the second AC voltage.

16. The method according to claim 14, further comprising the step of: varying a phase difference between the first and second AC voltages for setting a position of the charged particle beam relative to the aperture of the stop.

17. The method according to claim 14, further comprising the step of: determining a size of the aperture of the stop and/or determining a diameter of the charged particle beam.

18. The method according to claim 14, further comprising the step of: determining the kinetic energy which the charged particle beam has upon entering the beam blanker.

19. A computer program stored on a machine-readable medium, the computer program comprising instructions which when executed by a computer system causes the computer system to perform the method steps in claim 14.

20. The computer program of claim 19, further comprising instructions that when executed by the computer system causes the computer system to perform the method step of: determining a maximum length of the pulse period by minimizing a settable difference frequency between the first frequency of the first AC voltage and the second frequency of the second AC voltage.

21. The beam blanker of claim 11 in which the electromagnetic coupling member compromises a transformer.

* * * * *

UNITED STATES PATENT AND TRADEMARK OFFICE
CERTIFICATE OF CORRECTION

PATENT NO. : 10,410,820 B2
APPLICATION NO. : 15/824004
DATED : September 10, 2019
INVENTOR(S) : Michael Budach and Christof Baur Page 1 of 1

It is certified that error appears in the above-identified patent and that said Letters Patent is hereby corrected as shown below:

In the Specification

Column 13
Line 7, delete "$T_{ON}$ inversely" and insert -- $T_{ON}$ varies inversely --

In the Claims

Column 26
Line 21 (Approx.), in Claim 21, delete "compromises" and insert -- comprises --

Signed and Sealed this
Seventeenth Day of December, 2019

Andrei Iancu
*Director of the United States Patent and Trademark Office*